(12) United States Patent
Gong et al.

(10) Patent No.: US 8,871,366 B2
(45) Date of Patent: Oct. 28, 2014

(54) CORROSION RESISTANT COATING FOR COPPER SUBSTRATE

(71) Applicant: Seagate Technology LLC, Cupertino, CA (US)

(72) Inventors: Yongping Gong, Eagan, MN (US); Kristoffer Steven Scheponik, Lakeville, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/903,512

(22) Filed: May 28, 2013

(65) Prior Publication Data

US 2013/0252018 A1 Sep. 26, 2013

Related U.S. Application Data

(63) Continuation of application No. 12/415,815, filed on Mar. 31, 2009, now Pat. No. 8,449,995.

(51) Int. Cl.
*G11B 5/39* (2006.01)
*C23C 14/02* (2006.01)
*C23C 28/00* (2006.01)
*C23C 14/06* (2006.01)
*C23C 30/00* (2006.01)

(52) U.S. Cl.
CPC ............. *C23C 30/005* (2013.01); *C23C 14/025* (2013.01); *C23C 28/343* (2013.01); *C23C 28/341* (2013.01); *C23C 14/0605* (2013.01); *C23C 28/321* (2013.01); *C23C 28/34* (2013.01); *C23C 28/42* (2013.01)

USPC ........ 428/811.2; 428/332; 428/408; 428/814; 428/816; 427/580

(58) Field of Classification Search
None
See application file for complete search history.

(56) References Cited

U.S. PATENT DOCUMENTS

| | | | |
|---|---|---|---|
| 5,031,029 A | 7/1991 | Acocella et al. | |
| 6,736,949 B2 | 5/2004 | Shi et al. | |
| 7,014,738 B2 | 3/2006 | Shi et al. | |
| 7,174,622 B2 | 2/2007 | Meyer et al. | |
| 2004/0137725 A1 | 7/2004 | Cheah et al. | |
| 2007/0196673 A1 | 8/2007 | Hancer et al. | |
| 2008/0075625 A1 | 3/2008 | Jabs et al. | |
| 2010/0129615 A1 | 5/2010 | Chizik et al. | |

FOREIGN PATENT DOCUMENTS

WO WO2008015016 A1 2/2008

OTHER PUBLICATIONS

Erdemir, A. and Donnet, C.; "Tribology of Diamon-Like Carbon Fils: Recent Progress and Future Prospects", J Phys. D. Appln. Phys.: 39 (2006) R311-R327.

*Primary Examiner* — Mark Ruthkosky
*Assistant Examiner* — Daniel J Schleis
(74) *Attorney, Agent, or Firm* — HolzerIPLaw, PC

(57) ABSTRACT

A protecting coating for a copper substrate is disclosed. The coating comprises seed layer comprising titanium ions that forms an "alloy-like" structure with the copper substrate. The coating further comprises a first layer of carbon disposed on the seed layer comprising titanium ions. A second layer comprising titanium is disposed on the first layer of carbon, and a second layer of carbon is disposed on the second layer comprising titanium.

19 Claims, 2 Drawing Sheets

CORROSION RESISTANT COATING FOR COPPER SUBSTRATE

PRIORITY CLAIM

The present application is a continuation application of U.S. patent application Ser. No. 12/415,815, filed Mar. 31, 2009, and titled "Corrosion Resistant Coating for Copper Substrate", and expected to issue on May 28, 2013 as U.S. Pat. No. 8,449,995, which is hereby incorporated by reference in it's entirety.

BACKGROUND

Copper components are widely used in many modern electronic devices and other manufactured goods. Copper has the second highest electrical conductivity among the elements and is also a good thermal conductor. The metal is easily worked and readily available. However, one drawback to copper in some uses is that it reacts with oxygen in the air to form a layer of copper oxide.

A similar problem is encountered with some other metals used in electronic devices, but most of these other metals can be protected from corrosion at air bearing surfaces with a thin film of diamond like carbon (DLC). Such films on bare copper have been found to be inadequate to protect the surface over the long term. Corrosion rates of DLC films on copper substrates have been found to be 1 to 2 orders of magnitude worse (higher) than those on NiFe substrates or similar substrates.

This problem results in a corrosion risk for copper surfaces exposed to oxygen. In disc drives, for example, Air Bearing Surfaces (ABS) of recording head transducer designs may have exposed copper surfaces that are at risk for corrosion. If a recording head transducer becomes corroded, the surface will become covered with copper oxide, and the DLC film may delaminate. In addition, in many electronic devices the physical clearances are very small, and corrosion may interfere with the device physically, as well as magnetically and electronically.

SUMMARY

A protective coating comprising titanium and carbon that exhibits an improved ability to protect a copper component from corrosion is provided. A method for increasing or enhancing corrosion resistance of copper components in a variety of manufactured goods such as electronic products is also provided. In some embodiments, such a protective coating may prolong the life of copper or copper alloy surfaces for years.

In one embodiment, a manufactured article comprises a copper substrate and a corrosion resistant coating comprising titanium and carbon.

In another embodiment, a component comprises a copper substrate with a coating. The coating comprises: a first layer of titanium ions disposed on the copper substrate; a first layer of carbon disposed on the first layer of titanium ions; a second layer of titanium disposed on the first layer of carbon; and a second layer of carbon disposed on the second layer of titanium.

In yet another embodiment, a method of making a coating for a copper surface with improved corrosion resistance is provided. The method comprises: disposing a first layer of titanium ions on the copper surface; disposing a first layer of carbon on the first layer of titanium ions; disposing a second layer of titanium on the first layer carbon; and disposing a second layer of carbon on the second layer of titanium.

Additional aspects and advantages of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the features are not necessarily drawn to scale but rather are drawn as to best illustrate the pertinent features, wherein.

DETAILED DESCRIPTION

An exposed copper surface of a device is altered by providing a titanium alloy-like seed layer coating. Various methods of making such an alloy-like seed layer coating and components comprising the titanium alloy-like seed layer coating are provided. The provided titanium seed layer coating may reduce or eliminate problems that can occur when copper surfaces come in contact with air.

As used in this application, copper or Cu refers to elemental copper or a copper alloy susceptible to oxidation when exposed to air. Further, titanium or Ti refers to elemental titanium, titanium ions or an alloy containing elemental titanium and/or titanium ions. Carbon or C refers to carbon in some form, such as diamond like carbon (DLC).

Figure 1:
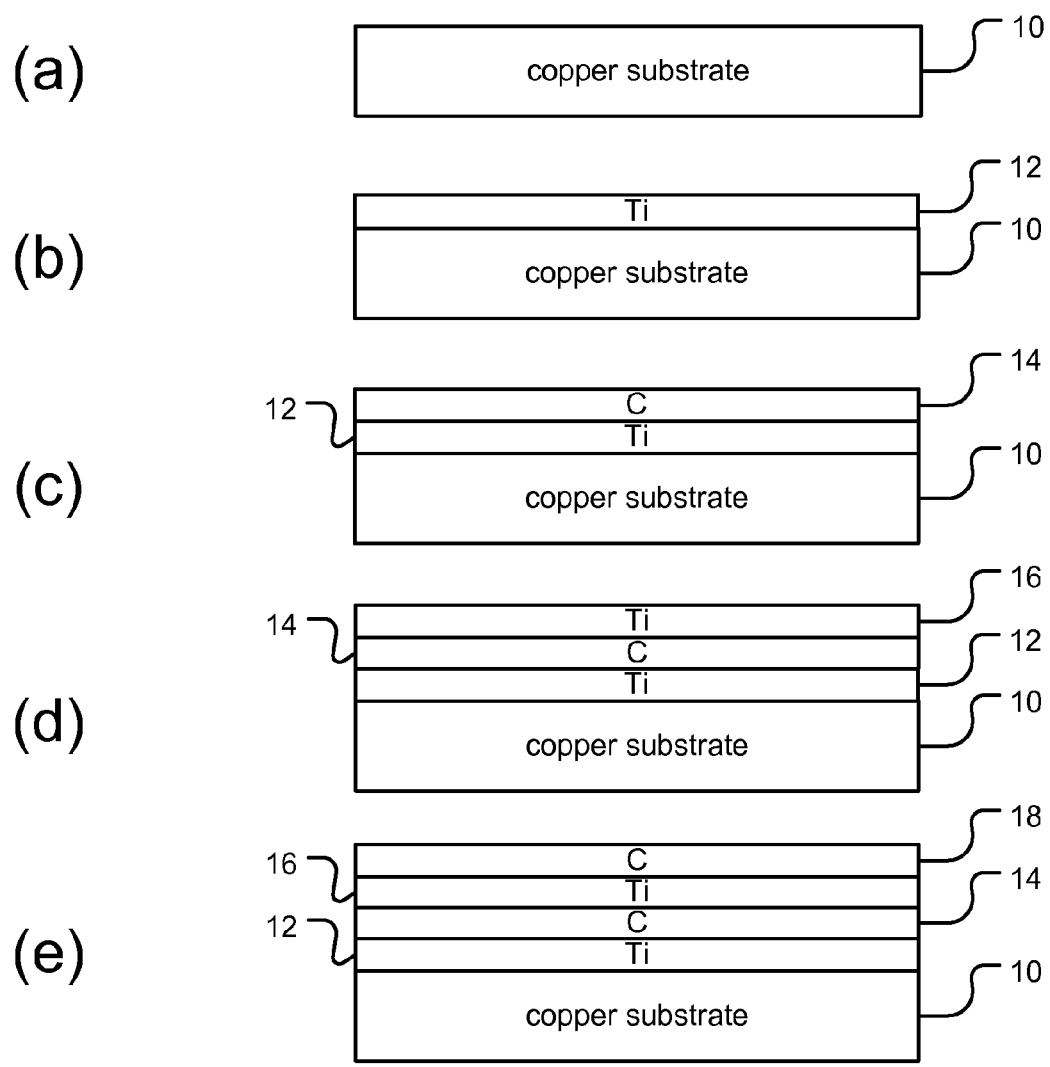
FIG. 1 shows a method of treating a copper surface to produce an alloy-like seed layer.

FIG. 1 shows an example method of making a protective coating for a copper substrate. The process begins with the provision of the copper substrate 10 to be coated. In some circumstances, an optional initial step of removing native copper oxide or other contaminants from the copper substrate 10 may be performed. Contaminants may interfere with the bonding between titanium ions and the copper substrate. Cleaning of the substrate, if necessary, may be accomplished in some embodiments by etching the surface of the copper substrate with an ion beam.

A first seed layer 12 of the protective coating is provided on the surface of the copper substrate 10. This layer comprises titanium. The titanium of this layer may form an alloy-like structure with the underlying copper substrate. This layer may be disposed on the copper surface by any method known in the art. In some embodiments, for example, this layer is deposited by filtered cathodic arc. In one embodiment, for example, the material deposited may consist essentially of titanium ions deposited by filtered cathodic arc. In this embodiment, the titanium ions form a particularly good seed layer for copper substrates used in electronic devices.

A first layer of carbon 14 is disposed on the titanium layer 12. Again, this layer may be disposed on the titanium layer 12 by any method known in the art. In some embodiments, the carbon is deposited by filtered cathodic arc. In one embodiment a very dense type of carbon called diamond like carbon (DLC) may be deposited via filtered cathodic arc. Carbon deposited in this manner may have a very high density, such as about 2.5-2.8 g/cm$^3$. By comparison, carbon density in diamond is about 3.5 gm/cm$^3$. This embodiment finds particular utility in electronic devices requiring very tight clearances such as recording head transducers because the density of the carbon allows for the creation of a very thin film that provides corrosion resistance comparable to standards in the art for other materials and is compatible with the very small physical clearances in recording devices.

A second layer comprising titanium 16 is disposed on the first carbon layer 14. Again, in some embodiments, this layer may comprise titanium ions. This layer may be disposed on the surface of the first carbon layer 14 by any method known in the art. In some embodiments, this layer is deposited by filtered cathodic arc. In one embodiment, the material deposited may consist essentially of titanium ions deposited by filtered cathodic arc.

A second layer of carbon (18) is then disposed on the second layer of titanium. Again, this layer may be disposed on the surface by any method known in the art. In some embodiments, this layer is deposited by filtered cathodic arc. In one such embodiment the material deposited may consist essentially of diamond like carbon deposited via filtered cathodic arc.

In this embodiment, corrosion on air bearing copper surfaces can be eliminated, or at least substantially reduced or minimized, by a readily effectuated process comprising: disposing a seed layer of titanium (e.g., titanium ions) that forms an alloy-like structure with an underlying copper substrate; disposing a first layer of carbon; disposing a second layer of titanium; and disposing a final layer of carbon. In one embodiment, a DLC protective coating comprises a first layer of titanium ions, a first layer of diamond like carbon (DLC), a second layer of titanium ions, and a second layer of DLC carbon.

Copper surfaces comprising an alloy-like seed layer DLC coating can exhibit corrosion rates comparable to those using a NiFe material as substrate and Si as seed layer for a DLC protective coating. NiFe is chosen as a reference standard because it is the most common metal component in a magnetic read-write head of a hard disk drive (HDD) and its performance is considered acceptable by the industry.

In one embodiment optimized for use on elements in electronic devices, a complete alloy-like seed layer DLC is about 25 Angstroms (Å) thick. By comparison, the DLC thickness of the reference standard NiFe substrate is about 21 Å. In this embodiment, optimized for use with recording head transducer designs, the first titanium ion layer may be about 8 Å thick, the first DLC layer may be about 4 Å thick, the second titanium ion layer may be about 3 Å thick, and the final DLC layer may be about 10 Å thick.

As used herein, about or approximately means plus or minus 20% of the indicated distances or values. Thus, the total thickness of the embodiment described above for electronic elements is 20-30 Å. In one particular embodiment, the first titanium layer is thicker than the second titanium layer, and the second carbon layer is thicker than the first carbon layer. The term essentially pure means that the purity is that which can be obtained under ordinary experimental conditions. Thus, "essentially pure Ti ions" means the purity of Ti ions that are obtained using filtered cathodic arc.

Although the examples provided herein provide copper components of electronic systems such as recording head transducers, the techniques can be applied to any technologies that comprise copper elements susceptible to corrosion and such corrosion is desired to be reduced or eliminated.

Copper and copper alloys are being increasingly used for a variety of components in electronic devices such as copper wire; electromagnets; printed circuit boards; electromagnetic motors, generators, and transformers; electric relays; electric busbars; electric switches; vacuum tubes; cathode ray tubes; magnetrons in microwave ovens; wave guides for microwave radiation; integrated circuits; and heat sinks. The alloy-like seed layer DLC coating described herein may be used to increase corrosion resistance of copper components of these or other manufactured devices. In applications involving elements of manufactured products that are not subject to strict clearances, the alloy-like seed layer DLC coating of the invention may be thicker than those shown in the examples.

In the examples described herein, the protective coating is created using filtered cathodic arc deposition of the specified materials. An alloy-like coating using titanium and carbon can also be made using other methods of application such as chemical vapor deposition (CVD), sputtering, (e.g., with a pulsed mode), plating, and plasma-enhanced chemical vapor deposition (PECVD). Each layer of the alloy forming film may be made by a different technique.

For those skilled in the art of using DLC as corrosion protection for various metals, it is known that Si is traditionally used as the seed-layer, because it bonds well with metal substrates by forming Silicide and it also bonds well with a top DLC layer by forming SiC. For a copper substrate, however, Si does not work well as a seed-layer because it diffuses into the copper substrate. Thus, the use of copper in certain electronic components where oxidation is a problem, such as in recording head transducers, was problematic.

The present inventors, however, have determined that titanium, on the other hand, is a good barrier material by itself and does not get corroded easily. It adheres to a copper substrate via metal bonds and forms an "alloy"-like structure with copper. It also bonds well with a top DLC layer by forming TiC. This makes titanium an ideal seed-layer between the copper substrate and a DLC layer. End corrosion test (direct current polarography or DCP test) results demonstrate that a Ti—C—Ti sandwich structure provides the needed adhesion for carbon such as DLC to provide adequate corrosion protection for a copper substrate.

Example 1

The material shown in FIG. 2 was prepared using filtered cathodic arc (FCA) deposition of titanium ions and diamond like carbon as described below, and as shown in FIG. 1. In the embodiment of the coating shown in FIG. 2, each layer of titanium ions and diamond like carbon is very thin. In other embodiments of the invention or for other applications, the layers may be thicker.

The materials shown in Table 1 (included below) were prepared with filtered cathodic arc (FCA) deposition. The cathodic arc source uses electrical discharge in argon under very low pressure ($10^{-7}$ Tor) to generate carbon atoms and ions. For carbon deposition, the arc is generated from a graphite cathode and the point of origin is called the cathode spot. The magnetic field generated by a coil pushes the cathode spot out onto the working surface of the cathode. The vaporization of carbon within the source occurs at the surface of the cathode due to the high concentration of energy within the cathode spot. The vacuum arc discharge is sustained between the cathode and the anode. An automatic adjustable feed device (based on a user programmable power/time feature in the software) lowers the cathode into the duct to ensure uniform material use. The cathode can be lowered and raised manually.

The vaporized material then condenses on a substrate, forming a thin film. Since the arc is basically a current carrying conductor it can be influenced by the application of an electromagnetic field. This characteristic may be used to "filter out" the titanium atoms, so that only titanium ions are deposited on the substrate. (Neutral titanium atoms were found to lack the reactivity of titanium ions.)

The DLC carbon may also be deposited using the filtered cathodic arc (FCA) system. Carbon deposited in this manner has very high density, of about 2.5-2.8 g/cm$^3$. By comparison, diamond carbon density is about 3.5 gm/cm$^3$.

The filtering function also decreases the amount of macroparticles that reach the substrate, thus improving the quality of the carbon films deposited. An arc deposition system made by Nanofilm provides a double filter of cross-magnetic and electric field. In this type of system, only ions within a well defined energy range are allowed to reach the substrate, which may produce better films.

Apparatuses that may be used to deposit several layers of high quality films include a vacuum chamber, a filtered cathodic arc source providing a plasma beam containing the positive ions, a substrate to be coated, and a substrate holder. In this embodiment, the substrate holder is adapted to move the substrate across the beam of positive ions thereby to coat the substrate with the positive ions. In the cases where more than one type of element is desired to be deposited without losing vacuum, the apparatus may contain a second filtered cathodic arc source which is used to place a second layer of a different material onto the substrate. In this manner multiple layers may be provided. Multilayer coatings may also be made in which the deposition apparatus contains a filtered cathodic arc source and the source has at least two cathode targets, one in a vacuum chamber at a cathode station from which an arc can be generated, and the other or others store away from the cathode station. The cathode targets are interchangeable without breaking vacuum in the chamber.

The apparatuses may also provide methods for the deposition of very high quality carbon coatings. Baffles and additional filters can be used to limit the deposition of macroparticles. A filter duct may comprise at least one bend and a magnetic source for steering plasma through the bend of the filter duct to remove macroparticles from the plasma. A second filter may be located between the duct and the substrate, to further remove macroparticles from the plasma. The apparatus may also comprise a baffle with an aperture through which plasma can pass and a second magnetic means to provide a magnetic field in the region of the second filter for steering plasma through the aperture.

The thickness of each layer of deposited material may be monitored and controlled in real time by in-situ endpoint schemes. Some tools use in-situ ellipsometry where a reference silicon coupon is placed in the center of a pallet. The pallet also holds the parts being processed, and rotates during film deposition for maximizing uniformity. The thickness of the film deposited on the center coupon represents the film thickness deposited on the parts of interest. It is measured in real time by in-situ ellipsometer attached to the deposition system. The deposition process will stop automatically when the measured film thickness on the reference coupon reaches desired thickness.

Other methods of monitoring and controlling the thickness of deposited materials are known in the art and may also be used to monitor and control film formation.

Another method uses in-situ end point control for filtered cathodic arc (FCA) metal and carbon deposition processes. This method monitors the ion current intensity via the FCA deposition process, and uses the calibration between film thickness and ions collected to determine the end point.

If the substrate is not initially clean and free of contaminants, any method known in the art may be used to prepare a clean surface. In one embodiment, the step of pre-cleaning the substrate may be accomplished by using Argon (Ar) ion beam to remove native metal oxide before any seed layer and carbon film are deposited. Ion beam etching is a technique that uses individual atoms in an ion beam to ablate or clean a surface. This step of using an ion beam for cleaning the substrate prior to deposition, may be done in a separate apparatus, or may be done in the same chamber.

The apparatus may comprise a second filter that generates an ion beam and directs the beam at the substrate. Cleaning of the substrate prior to deposition or other surface treatment can be carried out in one apparatus. The ion beam generator may comprise one or more electric filaments.

The area upon which the cathode spot moves over the surface of the cathode may be limited or guided by magnetic fields that hold the cathode spot in the desired area or the working surface of the cathode. Application of the magnetic field may shift the cathode spot towards the slope of magnetic flux lines on the surface of the cathode.

A magnetic concentrator (manufactured from magnetic material and assembled just below the cathode inside the duct) is shaped to force the magnetic flux lines to remain perpendicular to the working surface of the cathode. A coil is installed on the outside of the duct that works in conjunction with the magnetic concentrator. These two devices working in concert may be used to ensure that the cathode spot does not move off the working surface of the cathode.

An electromagnetic cusp around the anode can be created to optimize the anodes functioning and the voltage drop across the arc. The anode top and center coils forms the positive magnetic field of the cusp; while the anode bottom forms the negative field of the cusp.

The plasma stream flows into the toroidal magnetic macroparticle filter. The filter obstructs the direct line-of-sight path between the cathode, where the microparticles are emitted, and the substrate. Coils installed around the duct produce a magnetic field that guides the plasma flux around the filter-induced obstruction. The macroparticles are trapped by the baffles within the duct and remain while the plasma (microparticles) continues on to the chamber. The duct is insulated electrically from the discharge source and the chamber by junctions of plastic isolating material.

The deflection coils provide magnetic fields that institute an offset location to the plasma beam. This bending of the beam provides an even distribution of the deposited material, when the fixture is rotated through the beam.

In the second, third, and fourth samples shown in Table 1, a copper substrate was deposited with a seed layer of the indicated materials.

In sample one, the substrate is NiFe and has Si as seed layer.

In all cases, the seed layer coated materials were coated with a final or top DLC carbon layer.

Table 1 illustrates the corrosion rates of various alternate materials used as a seed-layer for a DLC coating on copper substrates.

Example 2

The materials made by the method of Example 1 were then tested for corrosion resistance by the direct current polarography (DCP) method. Other methods of testing for corrosion are known in the art and may also be used.

To perform the DCP test, a sample (approximately 1 cm$^2$) of each of the indicated materials is placed in DCP solution (0.05 M NaCl, pH of 5.4 to 5.7), and testing is performed at room temperature. A potentiostat is used to sweep an electrochemical potential from a negative voltage up to a positive voltage, and the current that flows as a function of potential is measured. Current is essentially proportional to the corrosion rate.

Any protective coating applied to a metal substrate will fail under high enough stress. By the technique used herein to test the coating, a system will fail when a high enough potential (stress) is applied. By the DCP test, a coating failure is indicated by a particular point on the potential versus current curve where there is an abrupt increase in current at a relatively constant potential. The higher the potential that can be withstood without the abrupt change in current, the more robust the coating is.

Corrosion rates are then calculated and expressed as milli-inch per year (mpy).

A coating is deemed to provide adequate corrosion protection to the corresponding metal substrate if the coating is able to endure a specified current without exhibiting failure, expressed in the DCP test as a sudden slope change in the potential versus the current curve. The corrosion rate for the NiFe substrate (0.0111) is considered acceptable in the industry for manufacturing of a magnetic read/write head of an HDD, and a read/write head of this type would be expected to have a lifetime on an order of years. The results in Table 1 show that Si, CSiC and CSiN materials do not provide a favorable seed-layer between Cu substrate and DLC Carbon. The corrosion rate is 1-2 orders of magnitude worse (higher) for Cu substrate than that for NiFe substrate (reference standard).

TABLE 1

| Sample | Corrosion Rate (mpy) |
| --- | --- |
| Reference: 21 Å C with Si seed on NiFe | 0.0111 |
| Cu (Si as seed) | 0.202 |
| Cu (CSiC as seed) | 0.250 |
| Cu (CSiN as seed) | 1.34 |

Example 3

The goal of this experiment is to find an alternative seed-layer (other than those shown in Example 2) that bonds carbon to a copper substrate and provides improved corrosion resistance.

Figure 2:
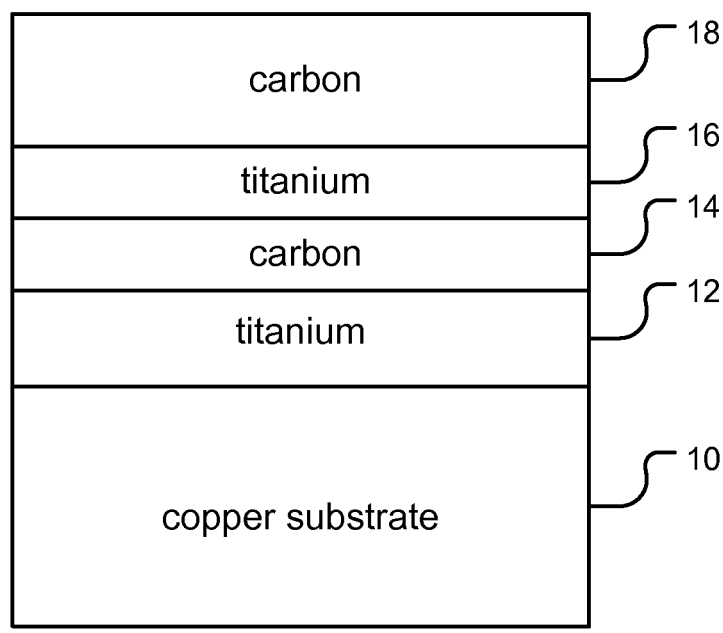
FIG. 2 is a drawing illustrating layers of one embodiment of an alloy-like seed layer, optimized for electronic components.

As shown in FIG. 2, a layer of titanium ions was deposited by FCA as seed-layer (essentially pure titanium ions for highest reactivity) that forms an alloy-like structure with underneath copper substrate and bonds well with carbon (forming TiC). A layer of diamond like carbon is then deposited, followed by a second layer of titanium ions.

Using a Ti—C—Ti "sandwich" structure at the beginning facilitates the transition from Ti seed layer to essentially pure diamond like carbon, which is the main material that provides the corrosion barrier. (A component made with 1 layer of Ti ions and 1 layer of DLC did not work as well for some applications, data not shown. A Ti—C—Ti sandwich structure, on the other hand, is much better at preventing the diffusion of titanium ions through the DLC layer.)

An example method of making the sandwich structure is shown in FIG. 1. Each layer is deposited of one element (that is, from one cathode target), and the subsequent layer can then be deposited, building up the protective coating. In one embodiment, the sequential layers are deposited in the filtered cathodic arc apparatus containing a filtered cathodic arc source with at least two cathode targets; one in a vacuum chamber at a cathode station from which an arc can be generated, and the other or others stored away from the cathode station. In this apparatus, the cathode targets may be interchangeable without breaking vacuum in the chamber. Thus, the multiple layers can be deposited in an efficient manner. The results shown in Table 2 illustrate a corrosion rate of a titanium alloy forming seed layer DLC compared to a reference standard.

TABLE 2

| Sample | Corrosion Rate (mpy) |
| --- | --- |
| Reference: 21 Å C with Si seed on NiFe | 0.0111 |
| Ti—C—Ti—C on Cu | 0.0474 |

This example demonstrates that the corrosion rate of the new alloy-like seed layer DLC coating is substantially reduced from the other methods using copper (more than 75% less), and is now within the same order of magnitude as the reference standard of NiFe.

The sandwiched structure of the coatings of this embodiment of the invention, Ti—C—Ti—C, is thought to minimize diffusion of titanium upward toward the surface of the on-top DLC layer. This reduces the possibility of titanium loss and consequent weakening between the copper substrate and the on-top DLC layer.

The improved resistance to corrosion provided by the inventive methodology facilitates manufacture of high quality copper components of many manufactured materials. Moreover, the inventive methodology can be readily practiced in cost-effective manner and is fully compatible with all aspects of automated manufacturing techniques.

Although embodiments of this invention have been described above with a certain degree of particularity, those skilled in the art could make numerous alterations to the disclosed embodiments without departing from the spirit or scope of this invention. All directional references (e.g., upper, lower, upward, downward, left, right, leftward, rightward, top, bottom, above, below, vertical, horizontal, clockwise, counterclockwise, on, adjacent, or the like) are only used for identification purposes to aid the reader's understanding of the present invention, and do not create limitations, particularly as to the position, orientation, or use of the invention. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other. Similarly, relative positional terms (e.g., or references to layers being disposed "on" another layer) do not necessarily infer that elements are directly adjacent to each other. For example, a layer referred to as being "disposed on" a substrate or layer may be disposed directly onto the substrate or layer or may include one or more intermediate layers between the respective layer and the underlying substrate or layer. It is intended that all matter contained in the above description or shown in the accompanying drawings shall be interpreted as illustrative only and not limiting. Changes in detail or structure may be made without departing from the spirit of the invention as defined in the appended claims.

What is claimed is:

1. A manufactured article comprising a copper substrate and a corrosion resistant coating, the coating comprising a seed layer of titanium ions less than about 25 Å thick and a first layer of carbon.

2. The article of claim 1 wherein the first layer of carbon comprises a layer of diamond like carbon.

3. The article of claim 1 wherein the coating comprises:
the seed layer of titanium ions disposed on the copper substrate; and
the first layer of carbon being a layer of carbon disposed on the seed layer of titanium ions.

4. The article of claim 3 wherein the coating further comprises:
another layer of titanium disposed on the first layer of carbon; and
a second layer of carbon disposed on the another layer of titanium.

5. The article of claim 4 wherein the another layer of titanium has a thickness less than the seed layer of titanium and wherein the second layer of carbon has a thickness greater than the first layer of carbon.

6. The article of claim 1 wherein the seed layer of titanium ions is about 8 Å thick.

7. The article of claim 1 wherein the coating results in a corrosion rate of the copper substrate of less than about 0.2 milli-inches per year.

8. The article of claim 1, wherein the seed layer of titanium ions is deposited using filtered cathodic arc (FCA) deposition method.

9. A component comprising:
a copper substrate;
a coating comprising a seed layer of titanium ions less than about 25 Å thick disposed on the copper substrate and a first layer of carbon disposed on the seed layer of titanium.

10. The component of claim 9, further comprising another layer of titanium disposed on the first layer of carbon.

11. The component of claim 10, further comprising a second layer of carbon disposed on the another layer of titanium.

12. The component of claim 11 wherein the another layer of titanium has a thickness less than the seed layer of titanium and wherein the second layer of carbon has a thickness greater than the first layer of carbon.

13. The component of claim 11 wherein the first and second layers of carbon comprise layers of diamond like carbon.

14. A device comprising a seed layer of titanium ions less than about 25 Å thick on a copper surface and a first layer of carbon on the seed layer of titanium.

15. The device of claim 14, further comprising another layer of titanium on the first layer of carbon.

16. The device of claim 15, further comprising second layer of carbon on the another layer of titanium.

17. The device of claim 16, wherein the another layer of titanium has a thickness less than the seed layer of titanium.

18. The device of claim 16, wherein the second layer of carbon has a thickness greater than the first layer of carbon.

19. The device of claim 14, wherein the first layer of carbon comprises a layer of diamond like carbon (DLC).

* * * * *